(12) United States Patent
Chang et al.

(10) Patent No.: US 11,515,239 B2
(45) Date of Patent: Nov. 29, 2022

(54) QUAD FLAT NO-LEAD PACKAGE STRUCTURE

(71) Applicant: Novatek Microelectronics Corp., Hsinchu (TW)

(72) Inventors: Hong-Dyi Chang, Hsinchu (TW); Tai-Hung Lin, Hsinchu (TW); Jhih-Siou Cheng, New Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 19 days.

(21) Appl. No.: 17/169,553

(22) Filed: Feb. 8, 2021

(65) Prior Publication Data
US 2022/0020673 A1    Jan. 20, 2022

Related U.S. Application Data

(60) Provisional application No. 63/051,869, filed on Jul. 14, 2020.

(51) Int. Cl.
*H01L 23/495*  (2006.01)
*H01L 23/00*   (2006.01)
*H01L 23/31*   (2006.01)

(52) U.S. Cl.
CPC ........ *H01L 23/49575* (2013.01); *H01L 23/31* (2013.01); *H01L 23/49541* (2013.01); *H01L 23/562* (2013.01)

(58) Field of Classification Search
CPC .............. H01L 23/49575; H01L 23/31; H01L 23/49541; H01L 23/562; H01L 23/3107; H01L 23/49548; H01L 2224/32245; H01L 2224/48091; H01L 2224/48247; H01L 2224/49171; H01L 2224/73265;
(Continued)

(56) References Cited

U.S. PATENT DOCUMENTS 9,013,035 B2 *   4/2015   Zhao ..................... H01L 21/565
                                                   257/E23.116
9,117,815 B2 *   8/2015   Sutardja ................. H01L 21/50
(Continued)

FOREIGN PATENT DOCUMENTS

TW         M615149           8/2021

OTHER PUBLICATIONS

"Office Action of Taiwan Counterpart Application", dated Aug. 31, 2021, p. 1-p. 8.

*Primary Examiner* — Bo B Jang
*Assistant Examiner* — Dilinh P Nguyen
(74) *Attorney, Agent, or Firm* — JCIPRNET

(57) ABSTRACT

A quad flat no-lead (QFN) package structure including a lead frame, a semiconductor die, and an encapsulating material. The lead frame includes a die pad and a plurality of contacts surrounding the die pad. The semiconductor die is disposed on the die pad and electrically connected to the plurality of contacts, wherein a shortest distance between the semiconductor die and a first side of the die pad is shorter than a shortest distance between the semiconductor die to a second side of the die pad, and the first side is opposite to the second side. The encapsulating material encapsulates the lead frame and the semiconductor die and partially exposing the plurality of contacts, wherein an aspect ratio of the QFN package is substantially equal to or greater than 3.

25 Claims, 2 Drawing Sheets

(58) Field of Classification Search
CPC .......... H01L 2924/181; H01L 23/4334; H01L 23/4952; H01L 23/49503
USPC ....................................................... 257/676
See application file for complete search history.

(56) References Cited

U.S. PATENT DOCUMENTS

2005/0263861 A1   12/2005  Ahn et al.
2008/0142938 A1    6/2008  Chow et al.
2009/0243054 A1   10/2009  Yeung et al.
2010/0219518 A1    9/2010  Hsu et al.
2015/0380384 A1*  12/2015  Williams ............ H01L 21/4842
                                                                  438/112
2018/0076177 A1    3/2018  Lu

* cited by examiner

QUAD FLAT NO-LEAD PACKAGE STRUCTURE

CROSS-REFERENCE TO RELATED APPLICATION

This application claims the priority benefit of U.S. provisional application Ser. No. 63/051,869, filed on Jul. 14, 2020. The entirety of the above-mentioned patent application is hereby incorporated by reference herein and made a part of this specification.

BACKGROUND

Technical Field

The present disclosure generally relates to a package structure. More particularly, the present disclosure relates to a quad flat no-lead package structure.

Description of Related Art

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As the demand for smaller electronic products increases, electronics industries must continuously develop higher-density electronic packaging. Various techniques have been developed to meet the demands for higher quality and improved reliability, and various chip scale package (CSP) techniques have been developed for high-density packages.

The quad flat no-lead (QFN) package is one of these CSP techniques, based on a lead frame and used for low pin count devices. The main characteristic of the QFN package is that it consists of no external leads, thus shortening the transmitting distance and reducing resistance to improve signal transmission.

Due to the mismatch of the coefficients of thermal expansion (CTE) for different materials of the packages, warpage of the packages may occur. Left uncontrolled, warpage may damage the QFN packages and result in reduced yields of semiconductor manufacturing. There is a need in the art for structures of and manufacturing methods for QFN packages with reduced warpage.

SUMMARY

Accordingly, the present disclosure is directed to a quad flat no-lead package structure with reduced warpage.

The present disclosure provides a quad flat no-lead (QFN) package structure including a lead frame, a semiconductor die, and an encapsulating material. The lead frame includes a die pad and a plurality of contacts surrounding the die pad. The semiconductor die is disposed on the die pad and electrically connected to the plurality of contacts, wherein a shortest distance between the semiconductor die and a first side of the die pad is shorter than a shortest distance between the semiconductor die to a second side of the die pad, and the first side is opposite to the second side. The encapsulating material encapsulates the lead frame and the semiconductor die and partially exposing the plurality of contacts, wherein an aspect ratio of the QFN package is substantially equal to or greater than 3.

According to an embodiment of the present disclosure, the QFN package structure further includes a plurality of conductive wires connecting between the semiconductor die and the plurality of contacts.

According to an embodiment of the present disclosure, the plurality of contacts comprises a plurality of first contacts closer to the first side and a plurality of second contacts closer to the second side, the plurality of conductive wires comprises a plurality of first conductive wires connecting between the semiconductor die and the plurality of first contacts and a plurality of second conductive wires connecting between the semiconductor die and the plurality of second contacts.

According to an embodiment of the present disclosure, each of the plurality of first conductive wires is substantially equal to or shorter than each of the plurality of second conductive wires.

According to an embodiment of the present disclosure, each of the plurality of first conductive wires is substantially equal to or shorter than 1000 µm.

According to an embodiment of the present disclosure, the QFN package structure further includes a ground ring surrounding a periphery of the die pad and a plurality of grounding wires connecting between the semiconductor die and the ground ring.

According to an embodiment of the present disclosure, the plurality of grounding wires comprises a plurality of first grounding wires connecting between the semiconductor die and a part of the ground ring on the first side and a plurality of second grounding wires connecting between the semiconductor die and another part of the ground ring on the second side.

According to an embodiment of the present disclosure, each of the plurality of first grounding wires is shorter than each of the plurality of second grounding wires.

According to an embodiment of the present disclosure, the QFN package structure further includes a warpage control metal layer disposed over the encapsulating material.

According to an embodiment of the present disclosure, a difference between a coefficient of thermal expansion (CTE) of the warpage control metal layer and a CTE of the lead frame is substantially equal to or less than 10%.

According to an embodiment of the present disclosure, the warpage control metal layer and the lead frame are located on two opposite sides of the encapsulating material.

According to an embodiment of the present disclosure, the QFN package structure further includes a solder resist layer disposed between the warpage control metal layer and the encapsulating material.

According to an embodiment of the present disclosure, the lead frame further comprises a plurality of tie bars connected to the die pad and extended outward to an outer rim of the encapsulating material.

According to an embodiment of the present disclosure, at least one of the tie bars is connected to the first side or the second side of the die pad.

According to an embodiment of the present disclosure, the die pad further comprises a plurality of dimples disposed on a spared region where the semiconductor die does not disposed.

According to an embodiment of the present disclosure, the plurality of dimples disposed along the second side.

According to an embodiment of the present disclosure, a thickness of the semiconductor die is substantially equal to or greater than 10 mil.

According to an embodiment of the present disclosure, a maximum thickness of the lead frame is substantially equal to or greater than 8 mil.

According to an embodiment of the present disclosure, a thickness of the encapsulating material is substantially equal to or greater than 0.6 mm.

According to an embodiment of the present disclosure, the QFN package structure further includes a die attach film disposed between the semiconductor die and the die pad.

The present disclosure provides a QFN package structure including a lead frame, a semiconductor die, an encapsulating material, and a warpage control metal layer. The lead frame includes a die pad and a plurality of contacts surrounding the die pad. The semiconductor die is disposed on the die pad and electrically connected to the plurality of contacts. The encapsulating material encapsulates the lead frame and the semiconductor die and partially exposes the plurality of contacts, wherein an aspect ratio of the QFN package is substantially equal to or greater than 3. The warpage control metal layer is disposed over the encapsulating material.

According to an embodiment of the present disclosure, a difference between a CTE of the warpage control metal layer and a CTE of the lead frame is substantially equal to or less than 10%.

According to an embodiment of the present disclosure, the warpage control metal layer and the lead frame are located on two opposite sides of the encapsulating material.

According to an embodiment of the present disclosure, the QFN package structure further includes a solder resist layer disposed between the warpage control metal layer and the encapsulating material.

According to an embodiment of the present disclosure, a shortest distance between the semiconductor die and a first side of the die pad is shorter than a shortest distance between the semiconductor die to a second side of the die pad, and the first side is opposite to the second side.

In light of the foregoing, the QFN package structure is designated to have a higher aspect ratio (about equal to or greater than 3) for better space utilization. In addition, for the QFN package structure having higher aspect ratio, the QFN package structure suffers severer warpage. Accordingly, the QFN package structure may further include a warpage control metal layer disposed over the encapsulating material, and the difference between the CTE of the warpage control metal layer and the CTE of the lead frame is substantially equal to or less than 10%. Therefore, the warpage control metal layer not only can help the QFN package structure with heat dissipation, but also can provide support and mechanical strength to the QFN package structure and reduce warpage of the QFN package structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The present disclosure will now be described more fully with reference to the accompanying drawings, in which exemplary embodiments of the invention are shown. The terms used herein such as "on", "above", "below", "front", "back", "left" and "right" are for the purpose of describing directions in the figures only and are not intended to be limiting of the invention. Reference will now be made in detail to the present preferred embodiments of the invention, examples of which are illustrated in the accompanying drawings. Moreover, in the following embodiments, the same or similar reference numbers denote the same or like components.

Figure 1:
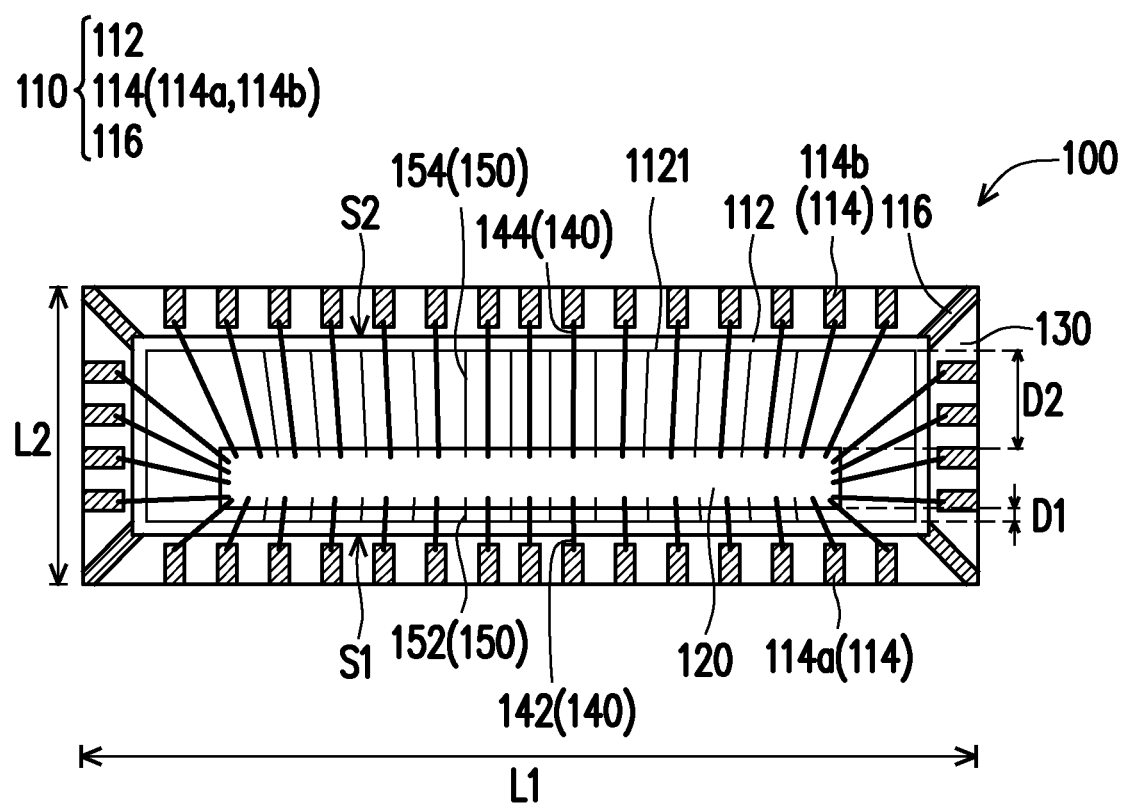
FIG. 1 illustrates a schematic top view of a QFN package structure according to some embodiments of the disclosure.
Figure 2:
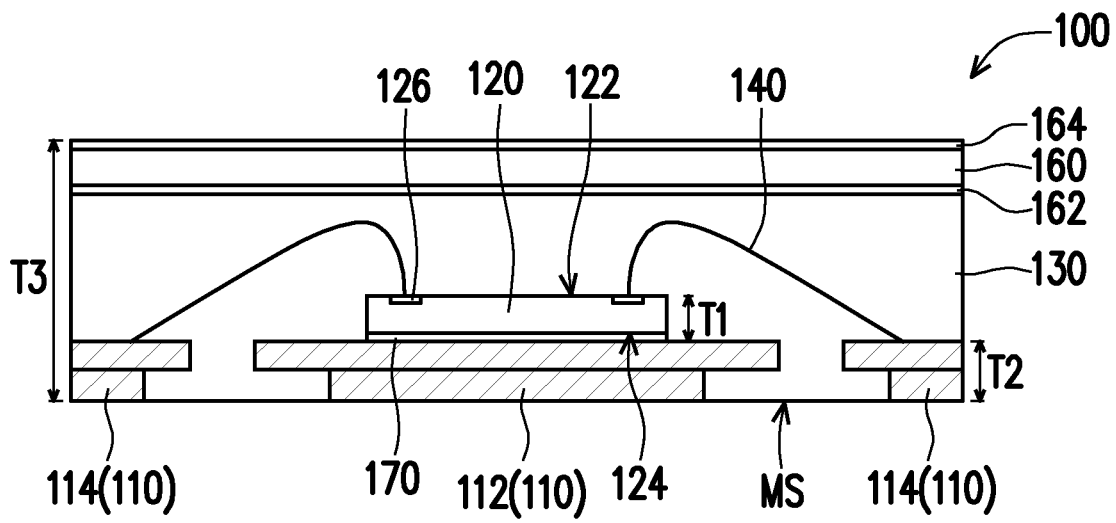
FIG. 2 illustrates a schematic cross sectional view of a QFN package structure according to some embodiments of the disclosure.

FIG. 1 illustrates a schematic top view of a QFN package structure according to some embodiments of the disclosure. FIG. 2 illustrates a schematic cross sectional view of a QFN package structure according to some embodiments of the disclosure. A package configuration known as a Quad Flat Nonleaded (QFN) package is similar to a QFP, however, respective contacts (leads) do not extend out of the QFN package. With hidden leads and a characteristic of tightly sticking to circuit boards during bonding, QFN packaging meets the demand of being light, thin, simple and compact for modern electrical components, especially components used in mobile electronics, such as smart phone, tablet PC, or notebook computers.

Referring to FIG. 1, in some embodiments, a quad flat no-lead (QFN) package structure 100 may include a lead frame 110, a semiconductor die 120, and an encapsulating material 130. In some embodiments, the lead frame 110 includes a die pad 112 and a plurality of contacts 114 surrounding the die pad 112. The lead frame 110 has an upper surface and a lower surface opposite to the upper surface. It is to be noted that the designation of the upper and lower surfaces is merely for the sake of convenience of description. It by no means denotes the physical directions of the lead frame 110. In some embodiments, the contacts 114 of the lead frame 110 may be a plurality of leads disposed around the die pad 112. As methods and manufacturing tools known in the art can be used to form the lead frame 110, materials known in the art can be used to form the lead frame 110. In some embodiments, copper (Cu), copper alloy materials, and a wide range of metal and metal alloy materials can be utilized in the fabrication of the lead frame 110 to suit a particular application. The lead frame 110 may be made of any suitable materials for use in semiconductor chip packages. Of course, specific materials may be used for certain packages with specific purposes.

In some embodiments, the semiconductor die 120 has an active surface 122, a back surface 124 opposite to the active surface 122, and a plurality of bonding pads 126 formed on the active surface 122 of the semiconductor die 120. In some embodiments, the semiconductor die 120 is disposed on the die pad 112 and electrically connected to the contacts 114 of the lead frame 110. In one embodiment, the back surface 124 of the semiconductor die 120 is adhered onto an upper surface of the die pad 112. The QFN package structure 100 may further include a plurality of conductive wires 140, which connect between the semiconductor die 120 and the contacts (leads) 114. To be more specific, the conductive wires 140 are electrically connect the bonding pads 126 of the semiconductor die 120 and the contacts 114 of the lead frame 110. That is, the semiconductor die 120 is disposed and bonded to the contacts 114 of the lead frame 110 through wire bonding technique. In some embodiments, the encapsulating material 130 encapsulates a part of the lead frame 110 and the semiconductor die 120. In one embodiment, the encapsulating material 130 encapsulates the semiconductor die 120, the conductive wires 140, the upper surface of the die pad 112, and the upper surfaces 114 of the contacts 114. In some embodiments, the lower surface of the die pad 112 and the lower surfaces of the contacts 114 are at least partially exposed by the encapsulating material 130 for further connections.

In some embodiments, for better space (layout) utilization, an aspect ratio of the QFN package structure 100 is designated to make a rectangular package. That is, the QFN package structure 100 is designated to have a higher aspect ratio (large length to width ratio). For example, the aspect ratio of the QFN package structure 100 may be about equal to or greater than 2.3. In the present embodiment, the aspect ratio of the QFN package structure 100 is substantially equal to or greater than 3. Under the condition of having the same pin (lead) counts and pin pitches, package size (footprint) of the QFN package structure 100 having higher aspect ratio can be reduced up to about 25% compared to a conventional square QFN package. In addition, with the configuration of the QFN package structure 100 having higher aspect ratio, the number of QFN packages that can be produced from each lead frame strip is increased. Accordingly, the production rate of the QFN package structure 100 can be improved and the production cost of the QFN package structure 100, on the other hand, can be reduced.

In accordance with some embodiments of the disclosure, the die pad 112 may have a first side S1 and a second side S2 opposite to each other. In the embodiment of the QFN package structure 100 being in a rectangular shape (i.e., having higher aspect ratio), the die pad 112 is in a rectangular shape correspondingly. In the present embodiment, the first side S1 and the second side S2 are two long sides of the die pad 112. In some embodiments, a shortest distance D1 between the semiconductor die 120 and the first side S1 of the die pad 112 is shorter than a shortest distance D2 between the semiconductor die 120 to the second side S2 of the die pad 112. In other words, the semiconductor die 120 is disposed on the die pad 112 in an asymmetry manner. Namely, the semiconductor die 120 is offset (deviated) from a central long axis of the die pad 112.

Accordingly, the contacts 114 may include a plurality of first contacts 114a and a plurality of second contacts 114b. The first contacts 114a is closer to the first side S1 while the second contacts 114b is closer to the second side S2. Similarly, the conductive wires 140 includes a plurality of first conductive wires 142 and a plurality of second conductive wires 144, wherein the first conductive wires 142 connects between the semiconductor die 120 and the plurality of first contacts 114a and the second conductive wires 144 connects between the semiconductor die 120 and the second contacts 114b. Accordingly, each of the first conductive wires 142 is substantially equal to or shorter than each of the second conductive wires 144, so as to reduce impedance of the first conductive wires 142. For example, each of the first conductive wires 142 is substantially equal to or shorter than 1000 μm. For the embodiment of the semiconductor die 120 being a driver IC of a display such as a Mini LED or a Micro LED, components therein that has higher sensitivity to impedance, such as switches or MOS, can be disposed on the side of the semiconductor die 120 that is closer to the first side S1, such that the impedance can be reduced and electrical performance of the semiconductor die 120 can be significantly improved.

In some embodiments, the QFN package structure 100 may further include a ground ring 1121 surrounding a periphery of the die pad 112 and a plurality of grounding wires 150 connecting between the semiconductor die 120 and the ground ring 1121. As such, ground pads of the semiconductor die 120 is connected to the ground ring 1121 through the grounding wires 150 to be grounded. In some embodiments, the ground ring 1121 may be a silver ring plated on the die pad 112. In the embodiment of the semiconductor die 120 offset toward the first side S1 of the die pad 112, the grounding wires 150 includes a plurality of first grounding wires 152 and a plurality of second grounding wires 154, wherein first grounding wires 152 connects between the semiconductor die 120 and a part of the ground ring 1121 on the first side S1, and the second grounding wires 154 connects between the semiconductor die 120 and another part of the ground ring 1121 on the second side S2. Accordingly, each of the first grounding wires 152 is shorter than each of the second grounding wires 154 to reduce the impedance of the first grounding wires 152. For example, each of the first grounding wires 152 is substantially equal to or shorter than 600 μm.

In the embodiment of the QFN package structure 100 having higher aspect ratio, the QFN package structure 100 may suffer severer warpage. Accordingly, the QFN package structure 100 may further include a warpage control metal layer 160 disposed over the encapsulating material 130. In some embodiments, the warpage control metal layer 160 may be a heat sink. Therefore, the warpage control metal layer 160 not only can help the QFN package structure 100 with heat dissipation, but also can provide support and mechanical strength to the QFN package structure 100. In some embodiments, the warpage control metal layer 160 and the lead frame 110 are located on two opposite sides of the encapsulating material 130, and a difference between a coefficient of thermal expansion (CTE) of the warpage control metal layer 160 and a CTE of the lead frame 110 is substantially equal to or less than 10%. In other words, the encapsulating material 130 is disposed between the lead frame 110 and the warpage control metal layer 160 with similar CTEs. Thereby, owing to the CTE of the warpage control metal layer 160 similar to that of the lead frame 110, issues of thermal stress and warpage caused by CTS mismatch between the lead frame 110 and encapsulating material 130 can be further improved.

In some embodiments, a barrier layer 164 such as a nickel/chromium layer may be disposed (deposited) over the warpage control metal layer 160 to prevent the warpage control metal layer (e.g., copper layer) 160 from oxidation. The warpage control metal layer 160 may be bonded to the encapsulating material 130 during the molding process via thermal compression (lamination). In some embodiments, a solder resist layer 162 may be disposed between the encapsulating material 130 and the warpage control metal layer 160 to enhance the bonding between the encapsulating material 130 and the warpage control metal layer 160. The configuration of the warpage control metal layer 160 reduces the thermal resistance of the QFN package structure 100 about 10% or above.

In some embodiments, the lead frame 110 further includes a plurality of tie bars 116 connected to the die pad 112 and extended outward to an outer rim of the encapsulating material 130. In general, the tie bars 116 would protrude outside the encapsulating material 130 during the molding process for connecting the die pad 112 to, for example, the lead frame strip. After the molding process, the protruding portions of the tie bars 116 are removed by cutting or dicing process, etc. In some embodiments, the tie bars 116 may have the shape of lead fingers and can be produced, for example, from foil or as a separately molded component. In some embodiments, the tie bars 116 may be disposed at corners of the die pad 112 extended outward to the outer rim of the encapsulating material 130 as it is shown in FIG. 1.

In accordance with some embodiments of the disclosure, for the QFN package structure that suffers severer warpage such as the QFN package structure having higher aspect ratio, some proportion of the components may be adjusted to reduce warpage of the package. For example, a thickness T1 of the semiconductor die 120 is substantially equal to or greater than 10 mil, a maximum thickness T2 of the lead frame 110 is substantially equal to or greater than 8 mil, and a thickness T3 of the encapsulating material 130 is substantially equal to or greater than 0.6 mm. However, the numbers illustrated above are merely for illustration. The disclosure is not limited thereto. In some embodiments, the semiconductor die 120 may be attached to the die pad 112 through a die attach film 170 instead of conventional silver paste to further reduce warpage of the QFN package structure 100a. Namely, the QFN package structure 100a may further include a die attach film 170 disposed between the semiconductor die 120 and the die pad 112.

Figure 3:
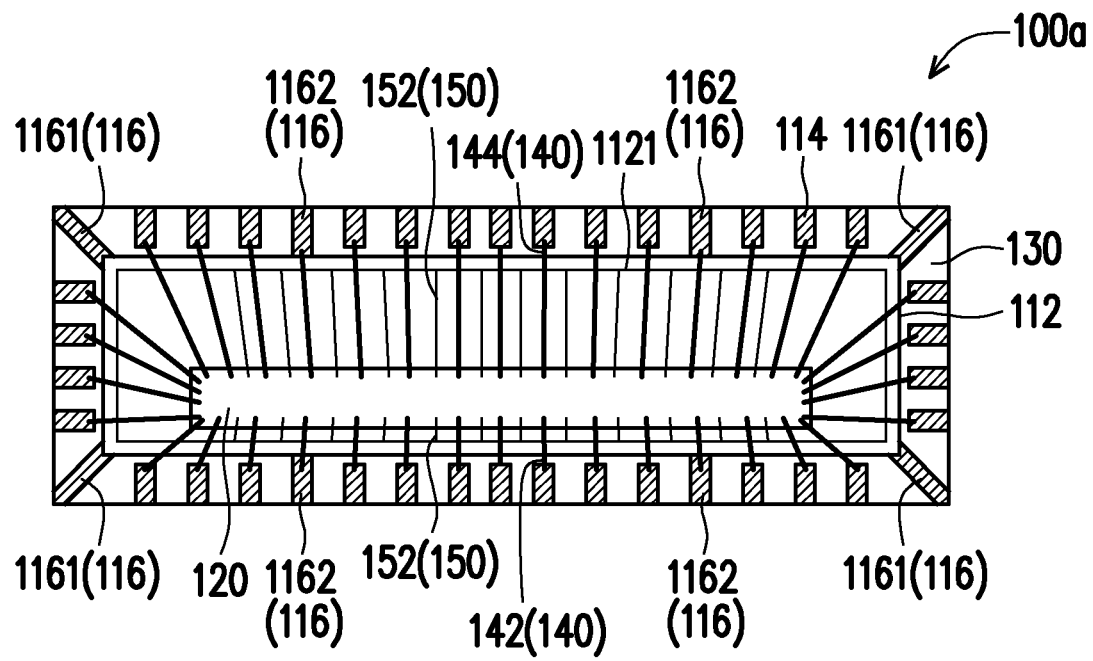
FIG. 3 illustrates a schematic top view of a QFN package structure according to another embodiment of the disclosure.

FIG. 3 illustrates a schematic top view of a QFN package structure according to another embodiment of the disclosure. It is noted that the QFN package structure 100a shown in FIG. 3 contains many features same as or similar to the QFN package structure 100 disclosed earlier with FIG. 1 and FIG. 2. For purpose of clarity and simplicity, detail description of same or similar features may be omitted, and the same or similar reference numbers denote the same or like components. The main differences between the QFN package structure 100a shown in FIG. 3 and the QFN package structure 100 shown in FIG. 1 and FIG. 2 are described as follows.

Referring to FIG. 3, in some embodiments, for the QFN package structure that suffers severer warpage such as the QFN package structure having higher aspect ratio, a part from the tie bars 116 disposed at the corners of the die pad 112, at least one of the tie bars 116 may be connected to the first side S1 or the second side S2 of the die pad 112. For example, the tie bars 116 may include a plurality of tie bars 1161 disposed at the corners of the die pad 112, and at least one tie bar 1162 disposed at (connected to) the first side S1 or the second side S2 of the die pad 112. In the present embodiments, the tie bars 116 includes a plurality of tie bar 1162 disposed at both of the first side S1 and the second side S2 of the die pad 112. That is, for the QFN package structure having higher aspect ratio, some of the tie bars 116 may be disposed at the long sides S1, S2 of the die pad 112 to provide mechanical strength and thereby reducing warpage.

Figure 4:
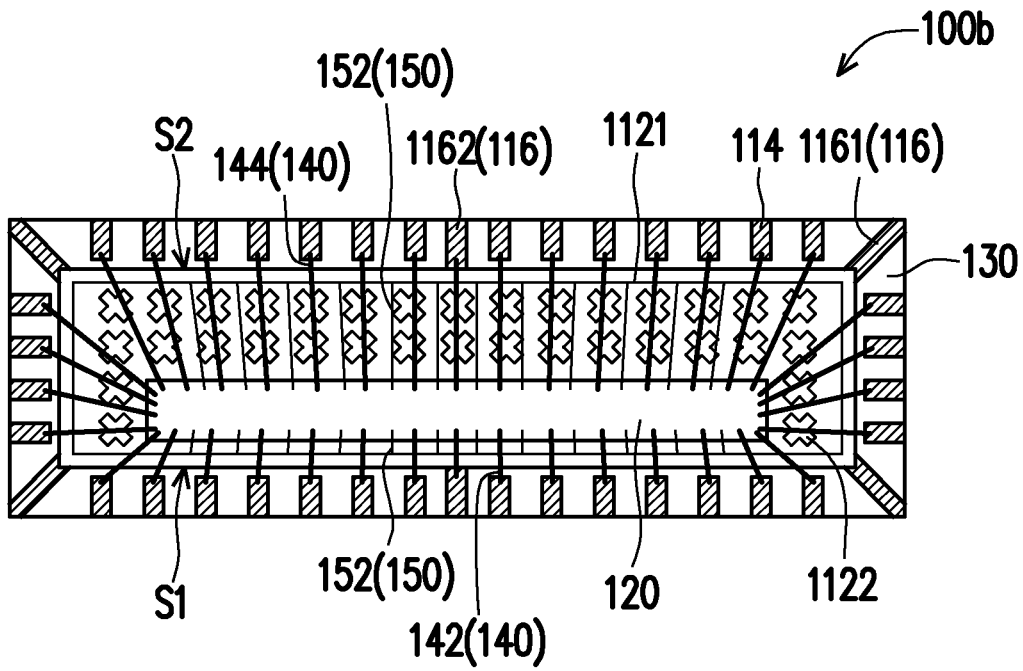
FIG. 4 illustrates a schematic top view of a QFN package structure according to yet another embodiment of the disclosure.

FIG. 4 illustrates a schematic top view of a QFN package structure according to yet another embodiment of the disclosure. It is noted that the QFN package structure 100b shown in FIG. 4 contains many features same as or similar to the QFN package structures 100, 100a disclosed in the previous embodiments. For purpose of clarity and simplicity, detail description of same or similar features may be omitted, and the same or similar reference numbers denote the same or like components. The main differences between the QFN package structure 100b shown in FIG. 4 and the QFN package structures 100, 100a disclosed in the previous embodiments are described as follows.

Referring to FIG. 4, in some embodiments, the die pad 112 may further include a plurality of dimples 1122 disposed on a spared region where the semiconductor die 120 does not disposed. For example, in the embodiment of the semiconductor die 120 shifting (offset) toward the first side S1 of the die pad 112, the dimples 1122 may be disposed along the second side S2 of the die pad 112. The dimples 1122 are concaves dented toward the lower surface of the die pad 112, and the encapsulating material 130 fills the dimples 1122 when encapsulating the QFN package structure 100b. As such, the configuration of the dimples 1122 increases contact area between the encapsulating material 130 and the die pad 112, so as to improve the bonding strength between the encapsulating material 130 and the lead frame 110. Accordingly, issues of delamination between the encapsulating material 130 and the lead frame 110 is reduced and the reliability of the QFN package structure is improved.

In sum, the QFN package structure is designated to have a higher aspect ratio (about equal to or greater than 3) for better space (layout) utilization. In addition, the semiconductor die is offset (shifted) toward a long side of the die pad to shorten the conductive wires on the long side, so that the impedance can be reduced and electrical performance of the semiconductor die can be significantly improved.

In addition, for the QFN package structure having higher aspect ratio, the QFN package structure suffers severer warpage. Accordingly, the QFN package structure may further include a warpage control metal layer disposed over the encapsulating material, and the difference between the CTE of the warpage control metal layer and the CTE of the lead frame is substantially equal to or less than 10%. Therefore, the warpage control metal layer not only can help the QFN package structure with heat dissipation, but also can provide support and mechanical strength to the QFN package structure and reduce warpage of the QFN package structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A quad flat no-lead (QFN) package structure, comprising:
   a lead frame comprising a die pad and a plurality of contacts surrounding the die pad;
   a semiconductor die disposed on the die pad and electrically connected to the plurality of contacts, wherein a shortest distance between the semiconductor die and a first side of the die pad is shorter than a shortest distance between the semiconductor die to a second side of the die pad, and the first side is opposite to the second side; and
   an encapsulating material encapsulating the lead frame and the semiconductor die and partially exposing the plurality of contacts, wherein an aspect ratio of the QFN package structure is substantially equal to or greater than 3.

2. The QFN package structure as claimed in claim 1, further comprising a plurality of conductive wires connecting between the semiconductor die and the plurality of contacts.

3. The QFN package structure as claimed in claim 2, wherein the plurality of contacts comprises a plurality of first contacts closer to the first side of the die pad and a plurality of second contacts closer to the second side of the die pad, the plurality of conductive wires comprises a plurality of first conductive wires connecting between the semiconductor die and the plurality of first contacts and a plurality of second conductive wires connecting between the semiconductor die and the plurality of second contacts.

4. The QFN package structure as claimed in claim 3, wherein each of the plurality of first conductive wires is substantially equal to or shorter than each of the plurality of second conductive wires.

5. The QFN package structure as claimed in claim 3, wherein each of the plurality of first conductive wires is substantially equal to or shorter than 1000 µm.

6. The QFN package structure as claimed in claim 1, further comprising a ground ring surrounding a periphery of the die pad and a plurality of grounding wires connecting between the semiconductor die and the ground ring.

7. The QFN package structure as claimed in claim 6, wherein the plurality of grounding wires comprises a plurality of first grounding wires connecting between the semiconductor die and a part of the ground ring on the first side of the die pad and a plurality of second grounding wires connecting between the semiconductor die and another part of the ground ring on the second side of the die pad.

8. The QFN package structure as claimed in claim 7, wherein each of the plurality of first grounding wires is shorter than each of the plurality of second grounding wires.

9. The QFN package structure as claimed in claim 1, further comprising a warpage control metal layer disposed over the encapsulating material.

10. The QFN package structure as claimed in claim 9, wherein a difference between a coefficient of thermal expansion (CTE) of the warpage control metal layer and a CTE of the lead frame is substantially equal to or less than 10%.

11. The QFN package structure as claimed in claim 9, wherein the warpage control metal layer and the lead frame are located on two opposite sides of the encapsulating material.

12. The QFN package structure as claimed in claim 9, further comprising a solder resist layer disposed between the warpage control metal layer and the encapsulating material.

13. The QFN package structure as claimed in claim 1, wherein the lead frame further comprises a plurality of tie bars connected to the die pad and extended outward to an outer rim of the encapsulating material.

14. The QFN package structure as claimed in claim 13, wherein at least one of the tie bars is connected to the first side or the second side of the die pad.

15. The QFN package structure as claimed in claim 1, wherein the die pad further comprises a plurality of dimples disposed on a spared region where the semiconductor die does not disposed.

16. The QFN package structure as claimed in claim 15, wherein the plurality of dimples disposed along the second side of the die pad.

17. The QFN package structure as claimed in claim 1, wherein a thickness of the semiconductor die is substantially equal to or greater than 10 mil.

18. The QFN package structure as claimed in claim 1, wherein a maximum thickness of the lead frame is substantially equal to or greater than 8 mil.

19. The QFN package structure as claimed in claim 1, wherein a thickness of the encapsulating material is substantially equal to or greater than 0.6 mm.

20. The QFN package structure as claimed in claim 1, further comprising a die attach film disposed between the semiconductor die and the die pad.

21. A quad flat no-lead (QFN) package structure, comprising:
a lead frame comprising a die pad and a plurality of contacts surrounding the die pad;
a semiconductor die disposed on the die pad and electrically connected to the plurality of contacts; and
an encapsulating material encapsulating the lead frame and the semiconductor die and partially exposing the plurality of contacts, wherein an aspect ratio of the QFN package is substantially equal to or greater than 3; and
a warpage control metal layer disposed over the encapsulating material.

22. The QFN package structure as claimed in claim 21, wherein a difference between a CTE of the warpage control metal layer and a CTE of the lead frame is substantially equal to or less than 10%.

23. The QFN package structure as claimed in claim 21, wherein the warpage control metal layer and the lead frame are located on two opposite sides of the encapsulating material.

24. The QFN package structure as claimed in claim 21, further comprising a solder resist layer disposed between the warpage control metal layer and the encapsulating material.

25. The QFN package structure as claimed in claim 21, wherein the a shortest distance between the semiconductor die and a first side of the die pad is shorter than a shortest distance between the semiconductor die to a second side of the die pad, and the first side is opposite to the second side.

* * * * *